United States Patent
Wilson et al.

(10) Patent No.: US 7,518,418 B1
(45) Date of Patent: Apr. 14, 2009

(54) RATIO GRANULARITY CLOCK DIVIDER CIRCUIT AND METHOD

(75) Inventors: Christopher Wilson, Ft. Collins, CO (US); Daniel Alan Berkram, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/903,948

(22) Filed: Sep. 25, 2007

(51) Int. Cl.
*H03K 21/00* (2006.01)
*H03K 23/00* (2006.01)
*H03K 25/00* (2006.01)

(52) U.S. Cl. .................................... 327/115

(58) Field of Classification Search .......... 327/115; 377/47, 48
See application file for complete search history.

(56) References Cited

U.S. PATENT DOCUMENTS

| 4,366,394 | A | 12/1982 | Clendening et al. |
| 5,477,181 | A | 12/1995 | Li et al. |
| 6,018,258 | A | 1/2000 | Kang |
| 6,121,801 | A | 9/2000 | Lee |
| 6,404,839 | B1 | 6/2002 | Fong et al. |
| 6,489,817 | B1 | 12/2002 | Wong et al. |
| 6,566,918 | B1 | 5/2003 | Nguyen |
| 6,617,893 | B1 | 9/2003 | Born et al. |
| 7,209,534 | B2 | 4/2007 | Lewis |
| 2007/0152720 | A1 | 7/2007 | Koh |

*Primary Examiner*—Donovan Lincoln
*Assistant Examiner*—Adam D Houston (57) ABSTRACT

In one embodiment, a ratio clock divider comprises circuitry for producing an input signal from a differential clock signal, part of which includes circuitry for extending a clock phase of the differential clock signal every $I^{th}$ cycle to produce the input signal, I being an integer. The ratio clock divider also includes circuitry for dividing the frequency of the input signal by I to produce a divided clock signal. The divided clock signal has a frequency that equals the frequency of the differential clock signal divided by N, N being equal to I plus a fraction F.

21 Claims, 5 Drawing Sheets

RATIO GRANULARITY CLOCK DIVIDER CIRCUIT AND METHOD

CROSS-REFERENCE TO RELATED APPLICATION(S)

This application discloses subject matter related to the subject matter disclosed in the following commonly owned co-pending patent application: "FIFTY PERCENT DUTY CYCLE CLOCK DIVIDER CIRCUIT AND METHOD," filed Sep. 25, 2007; application Ser. No. 11/903,950, in the name(s) of: Christopher Wilson and Daniel Alan Berkram, which is incorporated by reference herein.

BACKGROUND

Electronic circuits to divide the frequency of an input clock signal and create an output clock signal with a lower frequency are generally called clock dividers. Clock dividers may be used in a number of applications, e.g., in the feedback loop of a phase-locked loop (PLL). When a clock divider is able to provide greater granularity in the choice of divisors, the result may be a greater ability to reuse existing components in new circuits.

DETAILED DESCRIPTION OF THE DRAWINGS

Representative embodiments of the present patent disclosure will now be described with reference to various examples wherein like reference numerals are used throughout the description and several views of the drawings to indicate like or corresponding parts, and further wherein the various elements are not necessarily drawn to scale.

Figure 1:
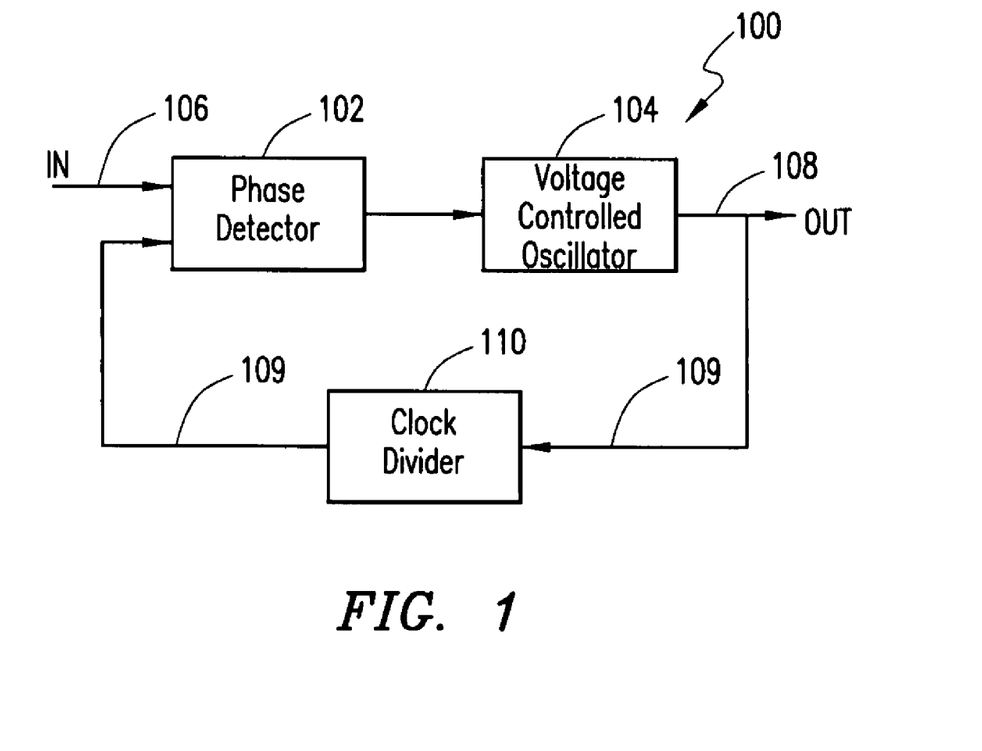
FIG. 1 illustrates a phase-locked loop which may use an exemplary ratio clock divider in accordance with an embodiment of the present disclosure.

With reference to FIG. 1, a phase-locked loop (PLL) is shown and generally designated 100, in which an embodiment of the disclosed ratio clock divider may be used. As is known, a phase-locked loop is an electronic circuit with a voltage- or current-driven oscillator that is constantly adjusted to lock on the frequency of an input signal. A PLL can be used to stabilize a communications channel, generate a signal, modulate or demodulate a signal, reconstitute a signal with less noise, or multiply or divide a frequency.

As shown in the embodiment of FIG. 1, PLL 100 contains phase detector 102 connected in series with voltage-controlled oscillator 104. Signal IN 106 is the input and signal OUT 108 is the output of the circuit. A feedback loop 109 containing clock divider 110 connects OUT 108 back to phase detector 102. Clock divider 110 may advantageously be embodied as a ratio clock divider according to an embodiment of the present disclosure. Having the ability to achieve a one-half granularity in the frequency division may allow reuse of a circuit and may provide better performance in the circuit.

Figure 2:
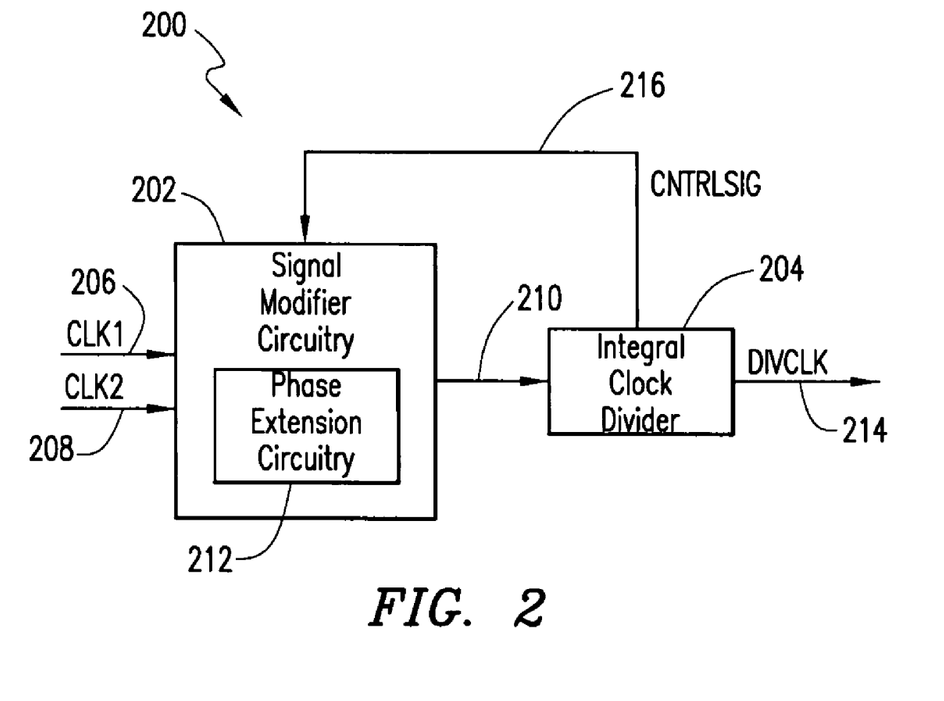
FIG. 2 illustrates a high-level diagram of a ratio clock divider in accordance with an embodiment of the present disclosure.

With reference to FIG. 2, a ratio clock divider 200 is illustrated according to an embodiment of the present disclosure. For the purposes of this application, a distinction is made between two types of clock dividers. An integral clock divider is defined as a clock divider that is designed to divide the input frequency by an integer, I, i.e., 2, 3, 4, etc. Depending on the design of the specific integral clock divider, I may be limited to even integers only, odd integers only, or both odd and even integers. In contrast, a ratio clock divider is defined as a clock divider that is capable of dividing the input frequency by a non-integer value N. The non-integer value N may be represented as an integer I plus a fraction F, i.e., N=I+F. In the following exemplary embodiments, F has a value of one-half or 0.5, which is generally the simplest ratio clock divider. One of ordinary skill in the art will realize, however, that other fractions can be achieved by modifying the disclosed embodiments. In addition to the ability to divide by non-integers, a ratio clock divider may have the capability to divide by integer values as well as non-integer values (e.g., 2, 2.5, 3, 3.5, etc.).

Ratio clock divider 200 may be conceptualized as two sub-circuits—signal modifier circuitry 202 and integral clock divider 204. Because of the design of ratio clock divider 200, signal modifier circuitry 202 may be added to an existing integral clock divider 204 in order to allow finer granularity in the choice of divisor. Signal modifier circuitry 202 receives a differential clock input that comprises two complementary clock signals CLK1 206 and CLK2 208, which are alternately used to create a source clock for the integral clock divider. When ratio clock divider 200 divides the input frequency by an integer, signal modifier circuitry 202 uses either CLK1 206 or CLK2 208 and this clock signal is passed through unaltered to become input signal 210, but when ratio clock divider 200 divides the input frequency by a non-integer value, signal modifier circuitry 202 modifies the input signal as will be explained herein below.

To divide by N=3.5, for example, signal modifier circuitry 202 can initially select one of complementary clock signals, CLK1 or CLK2 and can provide the signal to integral clock divider 204 as input signal 210. In at least some embodiments, the selection of CLK1 or CLK2 may be performed with a multiplexer. Integral clock divider 204 counts three cycles of the input signal and produce a pulse on output signal DIV-CLK 214. At approximately the same time, control signal CNTRLSIG 216 is sent to signal modifier circuitry 202, to trigger selection of the other complementary clock signal as the source clock for signal modifier circuitry 202. Switching the source clock used in signal modifier circuitry 202 effectively drops a phase from input signal 210 provided to integral clock divider 204, so that the integral clock divider is delayed by one-half cycle. Although integral clock divider 204 counts to three, the circuit will take three and one-half cycles to perform the count, effectively dividing by three and one-half. Special care may advantageously be taken to ensure that the switch between complementary clock signals CLK1 and CLK2 does not cause a glitch to occur on the input signal 210 that is sent to the integral clock divider 204. A glitch may be eliminated using phase extension circuitry 212, which blocks the phase on input signal 210 from changing for one phase, as will be further discussed below.

Figure 3:
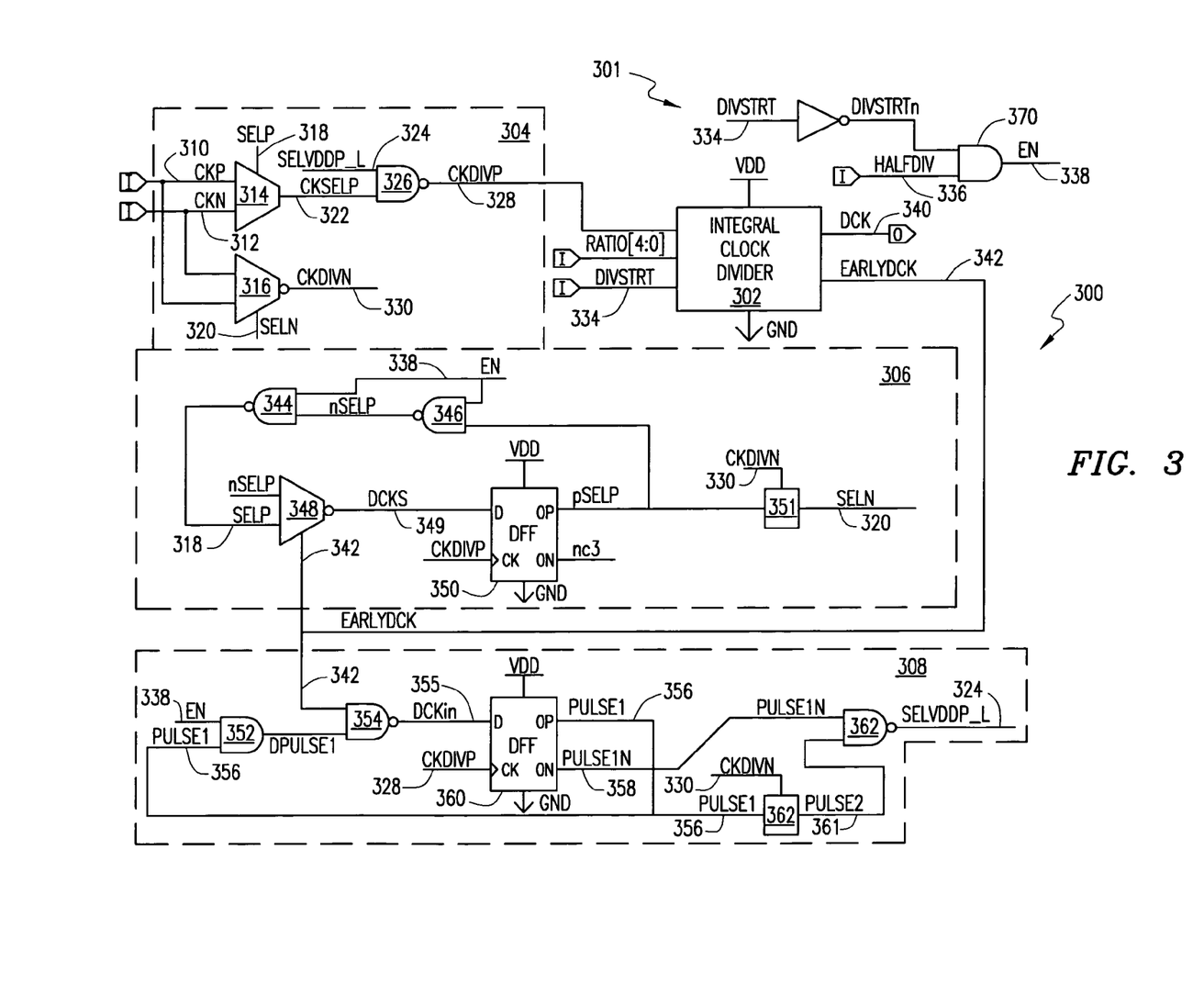
FIG. 3 illustrates an implementation of a ratio clock divider according to an illustrative embodiment of the present disclosure.
Figures 4, 5:
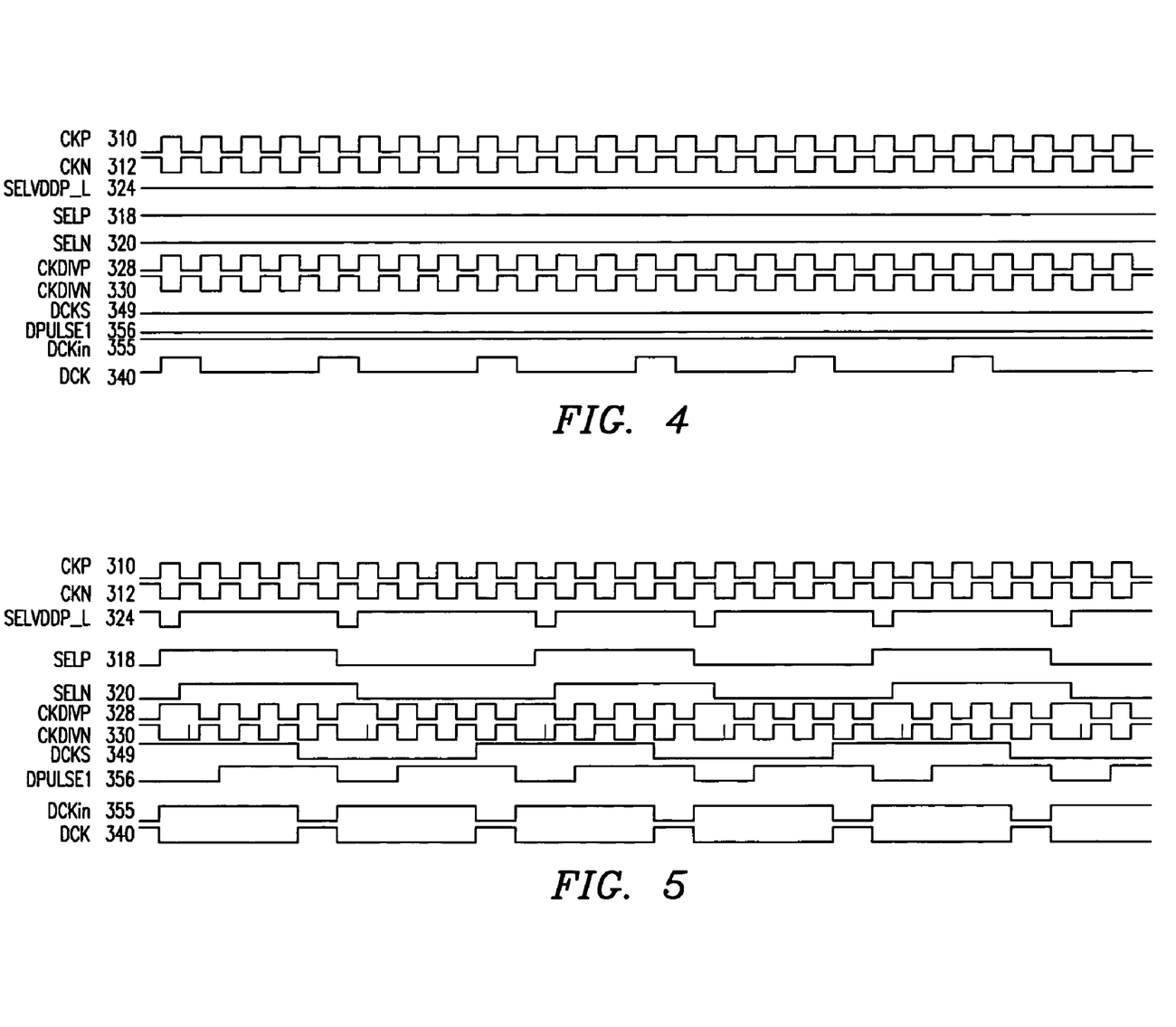
FIG. 4 illustrates a timing diagram associated with the embodiment of FIG. 3 in which an integer divisor is selected.
FIG. 5 illustrates a timing diagram associated with the embodiment of FIG. 3 in which a half-ratio divisor is selected.

With reference now to FIG. 3, ratio clock divider 300 is shown according to an embodiment of the present disclosure. The circuit can best be understood in terms of the timing signals produced by the circuit, so the drawing will be discussed in conjunction with FIGS. 4 and 5, which provide exemplary timing diagrams associated with this circuit. FIG. 4 illustrates an embodiment having ratio granularity disabled and which divides by four; FIG. 5 illustrates an embodiment having ratio granularity enabled and which divides by four and one-half. The half-ratio granularity may be enabled in this embodiment using the partial circuit portion 301. Signal DIVSTRT 334 is inverted and input, along with HALFDIV, into AND gate 370 to produce enable signal EN 338, which is used in state machines 306, 308 to control the signal modifications made in signal modification circuitry 304.

In the embodiment of FIG. 3, ratio clock divider 300 will be discussed with regard to four areas of the circuit—integral clock divider 302, signal modification circuitry 304, and two state machines 306, 308. One of ordinary skill in the art will recognize that although these areas are treated as discrete parts of the circuit, other embodiments of the circuit may combine the components in other groupings realized in different logic blocks to accomplish the same results without going outside the scope of the disclosure. Integral clock divider 302 generally corresponds to integral clock divider 204 of FIG. 2, while signal modification circuitry 304 and state machines 306, 308 generally correspond to signal modifier circuitry 202. Integral clock divider 302 receives power source VDD relative to ground GND, as well as inputs RATIO, DIVSTRT, and source clock input CKDIVP 328. The latter signal is produced in signal modification circuitry 304 and generally corresponds to input signal 210. RATIO may be used to determine the integer portion I of the divisor value N. Signal DCK 340 is output from integral clock divider 302 as the divided clock output of ratio clock divider 300. Integral clock divider 302 also outputs signal EARLYDCK 342, which is used by state machines 306, 308. In one embodiment, integral clock divider 302 may be a conventional clock divider to which the ability to provide ratio granularity is added.

Signal modification circuitry 304 generally modifies the differential clock input to form input signal CKDIVP 328. In the embodiment shown, differential clock signals CKP 310 and CKN 312 are complementary signals, as seen in FIGS. 4 and 5, such that when CKP is high, CKN is low and when CKP is low, CKN is high. Differential clock signals CKP 310 and CKN 312 are provided to multiplexer (MUX) 314 and to MUX 316, which inverts the output. MUX 314 selectively uses one of clock signal CKP 310 and CKN 312 to provide intermediate signal CKSELP 322, dependent upon control signal SELP 318. Intermediate signal CKSELP 322 is then input to NAND gate 326, along with control signal SELVDDP_L 324, to provide the signal CKDIVP 328 for input to the integral clock divider.

When ratio granularity is disabled as exemplified in FIG. 4, the values of control signals SELP 318, SELN 320, and SELVDDP_L 324 are high, such that MUX 314 passes one of clock signals CKP 310 and CKN 312 unchanged as CKSELP 322 and NAND gate 326 simply inverts this signal to create CKDIVP 328. MUX 316 will invert the remaining input clock signal to create CKDIVN 330.

In contrast, when ratio granularity is enabled as illustrated in FIG. 5, control signals SELP 318 and SELN 320 are driven between high and low values each time integral clock divider 302 produces an output clock pulse, with SELN tracking SELP one phase later. As SELP 318 and SELN 320 alternate values, MUX 314 and MUX 316 each alternately outputs clock signals CKP 310 and CKN 312, i.e., the input signal changes every time integral clock divider 302 counts to four in this example. Changing between the two clock signals effectively drops a phase in intermediate signal CKSELP 322 and in signal CKDIVN 330, so that these signals have a prolonged phase at the time of switching. Because the signals are switched just before a phase change, a glitch in the signal can be observed in signal CKDIVN. It is desirable that this glitch not be in the signal presented to integral clock divider 302, so intermediate signal CKSELP 322 is input to NAND gate 326 along with SELVDDP_L 324, which is produced in state machine 308. SELVDDP_L 324 can be selectively turned on by state machine 308 in order to hold the phase of signal CKDIVP 328 high during the switch-over between CKP and CKN. As seen in FIG. 5, signal CKDIVP 328 does not reflect a glitch due to the input clock change.

State machine 306 of FIG. 3 can advantageously produce signals SELP 318 and SELN 320, which are used to control MUXs 314, 316. State machine 306 can receive control signal EARLYDCK 342 from integral clock divider 302 each time the integral clock divider completes a count to I. EARLYDCK 342 can be used in MUX 348 to select one of signals SELP 318 and nSELP; the output from MUX 348, i.e. DCKS, is then input to D-flip-flop 350 along with signal CKDIVP 328, which is output from signal modification circuitry 304. Output signal pSELP of D-flip-flop 350 is fed to latch 351, which also receives signal CKDIVN 330 from signal modification circuitry 304 and outputs signal SELN 320. Signal pSELP is also fed back into MUX 348 through a loop that includes two NAND gates 344, 346, each of which also receives enable signal EN 338.

When ratio granularity is disabled, the value of EN 338 forces the outputs from NAND gates 344, 346 high, so that nSELP and SELP have the same value. When this is true, the output of MUX 348, i.e., DCKS 349, remains constant, as does the output from D-flip-flop 350. Consequently, the values of SELP 318 and SELN 320 remain constant, also. When these control signals are received in signal modification circuitry 304, their constant values means that the same input clock, either CKP 310 or CKN 312 is always used. However, when ratio granularity is enabled, the output of NAND gate 344, i.e., nSELP, is the inverse of the output of NAND gate 346, i.e., SELP 318. In this embodiment, MUX 348, under the control of signal EARLYDCK 342, outputs signal DCKS 349 as a signal that alternates phase every 4 and one-half cycles of input clock CKP 312. Signals SELP 318 and SELN 320 are versions of DCKS 349 that are delayed for one and two clock cycles respectively. When signals SELP 318 and SELN 320 are received in signal modification circuitry 304, they can cause MUXs 314, 316 to periodically alternate between the two source clocks.

Turning now to state machine 308, signal EARLYDCK 342 from integral clock divider 302 may also be received in state machine 308, where this signal is input to NAND gate 354 as one of two inputs. The output from NAND gate 354 may be provided to D-flip-flop 360, along with clock signal CKDIVP 328 from signal modification circuitry 304. As output from D-flip-flop 360, PULSE1 356 will carry the same signal as DCKin 355, with the original signal delayed one clock cycle; PULSELN also carries the same signal as DCKin 355, but delayed two clock cycles. PULSE1 356 is fed to latch 362, which is controlled by CKDIVN 330, to create PULSE2 361. Both PULSELN 358 and PULSE2 361 may be provided to NAND gate 362 to create signal SELVDDP_L 324, which is used in signal modification circuitry 304 to prevent glitches in signal CKDIVP 328. PULSE1 356 of D-flip-flop 360 may also be provided to logic gate 352, which ANDs PULSE1 356 with the enable signal EN 338. The output of AND gate 352 provides the second input for NAND gate 354.

Accordingly, it can be seen that state machine 306 is operable as a means for selecting one of the complementary signals of a differential clock input, whereas state machine 308 is operable as a means for controlling the extension of a phase of an input clock signal synthesized from the differential clock input. Furthermore, signal modification circuitry 304 and associated state machines 306, 308 may be treated as ratio granularity circuitry that can be added to any known or heretofore unknown integral clock divider circuitry. Additionally, it will be realized that EARLYDCK signal is logically the same signal as DCK, the difference being that EARLYDCK emerges earlier than DCK. Whereas the EARLYDCK signal may be used to help speed up the ratio granularity circuitry when that circuitry is run at high frequencies, the DCK signal could be used in lieu of EARLYDCK if the ratio granularity circuitry were to run at a lower frequency.

When ratio granularity is disabled, as in FIG. 4, the value of signal EN 338 is forced to a constant value of zero, which in turn forces DCKin 355 to a constant value of one. As a result, SELVDDP_L 324 has a constant high value, so that when SELVDDP_L 324 is used as a control signal in signal modification circuitry 304, clock CKSELP 322 is passed through NAND gate 326 without modification. However, when ratio granularity is enabled, as in FIG. 5, DCKin as output from NAND gate 354 is complementary to signal DCK 340 output from integral clock divider 302. PULSE1 356 and PULSELN 358 provide delayed versions of DCKin 340, ultimately resulting in SELVDDP_L 324 being enabled low once each time integral clock divider 302 counts to I. The timing of the circuit is such that SELVDDP-L 324 is provided to NAND gate 326 in time to hold the pulse for signal CKDIVP 328 high, blocking the glitch from occurring in this signal.

Figure 6:
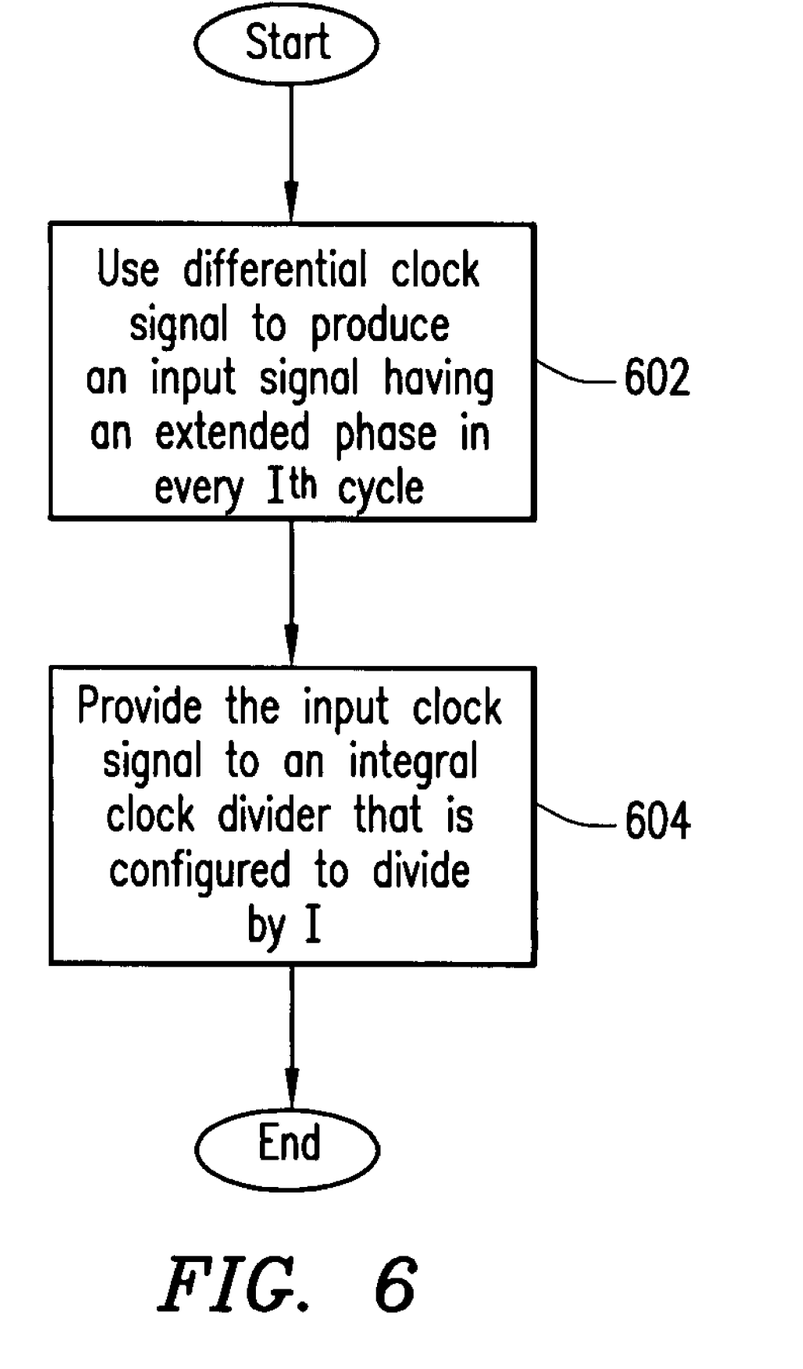
FIG. 6 discloses a method of generating a ratio-divided clock signal according to an embodiment of the present disclosure.

With reference now to FIG. 6, a scheme for generating a ratio divided clock signal according to one embodiment is shown. In this embodiment, an input clock is divided by the number N, wherein N is equal to an integer I plus 0.5, i.e., the divisor may be 2.5, 3.5, 4.5, etc. Differential clock signals are used to produce an input signal having a phase extended to last for two phases in every $I^{th}$ cycle (block 602). To say this another way, in every $I^{th}$ cycle, the cycle lasts one and a half times a "normal" cycle. The input signal is then provided to an integral clock divider that is configured to divide by I (block 604). Since the integral clock divider is counting to I and outputting a clock signal, but one of the I cycles is extended, the integral clock divider is in actuality counting to I plus 0.5.

Based on the foregoing Detailed Description, it may be appreciated that the embodiments set forth herein provide a ratio clock divider and method that can provide frequency division of a differential input signal by divisors that include non-integers. Since the embodiments of the ratio granularity circuitry can be run at very high frequencies, this feature can be advantageously utilized in a PLL application where the PLL's VCO may run at high frequencies as well. In other words, the ratio clock divider circuitry is capable of keeping up with the high operating frequencies of certain PLL applications.

Although the present patent disclosure has been described with reference to certain exemplary embodiments, it is to be understood that the forms of the embodiments shown and described are to be treated as illustrative only. Accordingly, various changes, substitutions and modifications can be realized without departing from the scope of the present disclosure as set forth in the following claims.

What is claimed is:

1. A ratio clock divider, comprising:
   circuitry for producing an input signal from a differential clock signal, wherein said circuitry for producing said input signal includes circuitry for extending a clock phase of said differential clock signal in every $I^{th}$ cycle to produce said input signal, I being an integer; and
   circuitry for dividing the frequency of said input signal by I to produce a divided clock signal, said divided clock signal having a frequency that equals the frequency of said differential clock signal divided by N, N being equal to I plus a fraction F.

2. The ratio clock divider according to claim 1, wherein said circuitry for dividing the frequency of said input signal produces a control signal used by said circuitry for producing an input signal.

3. The ratio clock divider according to claim 2, wherein said circuitry for dividing the frequency of said input signal produces said control signal every I cycles.

4. The ratio clock divider according to claim 1, wherein F=0.5 and said differential clock signal comprises two complementary signals.

5. The ratio clock divider according to claim 4, wherein said circuitry for producing an input signal comprises a multiplexer connected to select one of said two complementary signals to provide an intermediate clock signal and a control signal produced by said circuitry for dividing the frequency of said input signal indirectly triggers said multiplexer to alternately select each of said two complementary signals.

6. The ratio clock divider according to claim 5, wherein said control signal indirectly triggers said circuitry for extending a clock phase to extend one phase of said intermediate clock signal for two clock phases to produce said input signal.

7. The ratio clock divider according to claim 1, wherein said circuitry for producing an input signal can selectively bypass said circuitry for extending a clock phase.

8. A ratio clock divider, comprising:
   means for modifying a differential clock signal that comprises two complementary signals to create an input signal, said input signal having a phase in every $I^{th}$ cycle that is extended for two phases, I being an integer;
   means for dividing the frequency of said input signal by I to produce an output clock signal having a pulse every N cycles of said differential clock signal, N being equal to I plus a fraction F;
   first state machine means for selecting one of said two complementary signals; and
   second state machine means for controlling the extension of a phase of said input signal.

9. The ratio clock divider according to claim 8, wherein said means for modifying said differential clock signal alternately uses each of said two complementary signals to produce an intermediate clock signal.

10. The ratio clock divider according to claim 9, wherein said means for modifying said differential clock signal extends a phase of said intermediate clock signal every $I^{th}$ cycle to create said input signal.

11. The ratio clock divider according to claim 8, wherein said means for dividing the frequency of said input signal produces a first control signal that is used by said first state machine means and said second state machine means.

12. The ratio clock divider according to claim 8, wherein said means for modifying a differential clock signal comprises multiplexers operatively connected to said differential clock signal and a NAND gate that is coupled to one of said multiplexers.

13. The ratio clock divider according to claim 8, wherein said first state machine means comprises NAND gates, a multiplexer and a D-flip-flop operatively connected to each other.

14. The ratio clock divider according to claim 8, wherein said second state machine means comprises an AND gate, a D-flip-flop and NAND gates operatively connected to each other.

15. The ratio clock divider according to claim 8, wherein said fraction F is 0.5.

16. A method of generating a ratio-divided clock signal, the method comprising:
   using a differential clock signal to produce an input signal, every $I^{th}$ cycle of said input signal having a phase that is extended to last for two phases of said differential clock signal, I being an integer; and
   providing said input signal to an integral clock divider that is configured to divide the frequency by I to produce an output clock signal, wherein the frequency of said output clock signal equals the frequency of said differential clock signal divided by N, N being equal to I plus a fraction F.

17. The method of generating a ratio-divided clock signal according to claim 16, further comprising generating a control signal in said integral clock divider whenever said integral clock divider counts to I.

18. The method of generating a ratio-divided clock signal according to claim 17, wherein said control signal at least indirectly controls the production of said input signal.

19. The method of generating a ratio-divided clock signal according to claim 16, wherein using said differential clock signal to produce said input signal comprises alternately choosing each of complementary signals that form said differential clock signal to create an intermediate clock signal.

20. The method of generating a ratio-divided clock signal according to claim 19, wherein using said differential clock signal to produce said input signal further comprises periodically blocking said input signal from changing phase for one phase of said differential clock signal.

21. The method of generating a ratio-divided clock signal according to claim 16, wherein said fraction F is 0.5.

* * * * *

UNITED STATES PATENT AND TRADEMARK OFFICE
CERTIFICATE OF CORRECTION

PATENT NO. : 7,518,418 B1 Page 1 of 1
APPLICATION NO. : 11/903948
DATED : April 14, 2009
INVENTOR(S) : Christopher Wilson et al.

It is certified that error appears in the above-identified patent and that said Letters Patent is hereby corrected as shown below:

In column 4, line 62, delete "PULSELN" and insert -- PULSE1N --, therefor.

In column 4, line 65, delete "PULSELN" and insert -- PULSE1N --, therefor.

In column 5, line 30, delete "PULSELN" and insert -- PULSE1N --, therefor.

Signed and Sealed this

Fifteenth Day of September, 2009

David J. Kappos
*Director of the United States Patent and Trademark Office*